United States Patent

Ono et al.

[15] 3,643,137

[45] Feb. 15, 1971

[54] SEMICONDUCTOR DEVICES

[72] Inventors: Minoru Ono; Toshimitsu Momoi; Youji Kawachi, all of Tokyo-to, Japan

[73] Assignee: Kabushiki Kaisha Hitachi Seisakusho, Tokyo-to, Japan

[22] Filed: Feb. 10, 1969

[21] Appl. No.: 431,677

[30] Foreign Application Priority Data

Feb. 13, 1964 Japan....................................39/7388

[52] U.S. Cl................................317/235, 148/1.5, 148/33, 148/33.3

[51] Int. Cl.........................................................H01l 11/00

[58] Field of Search....................148/13, 1.5, 181, 185, 187, 148/33.3, 33; 252/62.3; 29/25.3; 117/200; 317/234, 235

[56] References Cited

UNITED STATES PATENTS

| | | | |
|---|---|---|---|
| 2,994,811 | 8/1961 | Senitzky | 317/235 |
| 2,986,481 | 5/1961 | Gudmundsen | 148/33 |
| 3,244,566 | 4/1966 | Mann et al. | 148/33 |
| 3,255,005 | 6/1966 | Green | 148/33.3 |
| 3,330,030 | 7/1967 | Broussard | 148/186 |
| 3,349,474 | 10/1967 | Rauscher | 148/187 |
| 3,349,475 | 10/1967 | Marinace | 148/187 |
| 3,384,829 | 5/1968 | Sato | 317/235 |
| 3,303,059 | 2/1967 | Kerr et al. | 148/13 |

FOREIGN PATENTS OR APPLICATIONS

| | | |
|---|---|---|
| 923,153 | 4/1963 | Great Britain |

OTHER PUBLICATIONS

Journal of The Electrochemical Society, 1963, Vol. 110, No. 6, pp. 527–533

*Primary Examiner*—Richard O. Dean
*Attorney*—H. Edward Mestern and Marmorek and Bierman

[57] ABSTRACT

A semiconductor device which has a semiconductive single crystalline substrate having a plane surface, and an insulating film such as silicon oxide covering said plane surface, in which said plane surface lies parallel to a crystal plane other than a 111plane, whereby the surface donor density is decreased. The surface donor density is minimized by subjecting said substrate to a heat treatment under application across said film of such a voltage as that which renders the electrode provided on said film negative polarity.

4 Claims, 7 Drawing Figures

INVENTOR.
Minoru Ono
Toshimitsu Momoi
Youji Kawachi

BY

H. Edward Mestern

INVENTOR.
Minoru Ono
Toshimitsu Momoi
Youji Kawachi

BY

H. Edward Mestern

SEMICONDUCTOR DEVICES

This invention relates to semiconductor devices and more particularly to new semiconductor devices in which semiconductors having oxide films on the surface thereof are utilized.

Surfaces of semiconductor bodies in which semiconductor devices are formed are extremely sensitive to conditions such as humidity of the ambient atmosphere, and, being affected thereby, their characteristics are easily caused to vary. In order to eliminate this disadvantage, it is known to provide oxide films or insulator material which is moisture resistant and is chemically stable such as, for example, silicon dioxide ($SiO_2$), on the surface of the semiconductors. A planar transistor is an example of semiconductor devices in which such passivating insulators are utilized. In planar transistors, a 111 crystal orientation has been used as a major surface in which diffusion regions are formed and which are covered with passivating insulators.

In the case where the above mentioned $SiO_2$ film is formed on the surface of a semiconductor substrate, an N-type conductivity layer appears on the surface of the semiconductor substrate immediately below the $SiO_2$ film, irrespective of the conductivity type of the substrate. This phenomenon is generally known as the channel effect. It is known further, as a method of controlling the size of this N-type channel layer, to apply a voltage to this layer. Accordingly, it has been proposed to produce field-effect transistors by utilizing the formation of this channel.

However, difficulties as will be described more fully hereinafter are encountered in the production of such semiconductor devices.

It is an object of the present invention to eliminate said difficulties.

According to the present invention, briefly stated, there is provided a semiconductor device in which an oxide film is formed on the surface of a semiconductor crystal having a crystal plane other than a 111 plane.

According to the present invention there is further provided a method for producing semiconductor devices which comprises forming an oxide film on the surface of a semiconductor crystal with a crystal plane other than a 111 plane and subjecting the semiconductor devices with said oxide film to heat treatment in the state of application of a voltage between the electrode on said oxide film and said semiconductor crystal.

The nature, principle, and details of the invention will be more clearly apparent from the following detailed description, when read in conjunction with the accompanying drawings in which like parts are designated by like reference characters, and in which.

FIGS. 3(*a*), 3(*b*), and 3(*c*) are graphical representations indicating characteristics of devices according to the invention and a conventional device.

Figure 4:
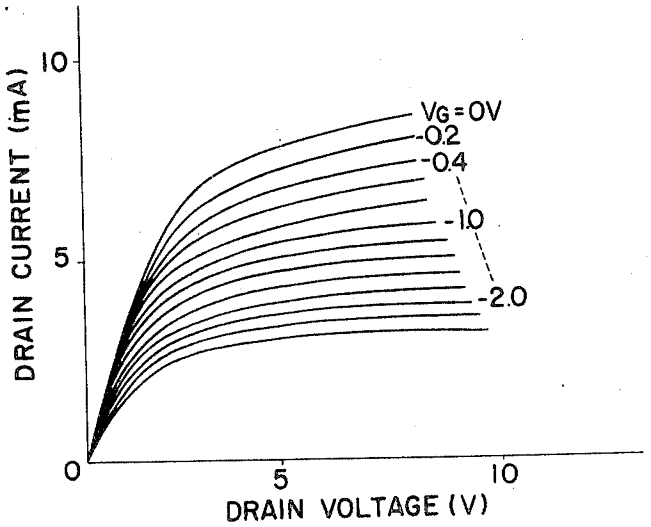
Figure 5:
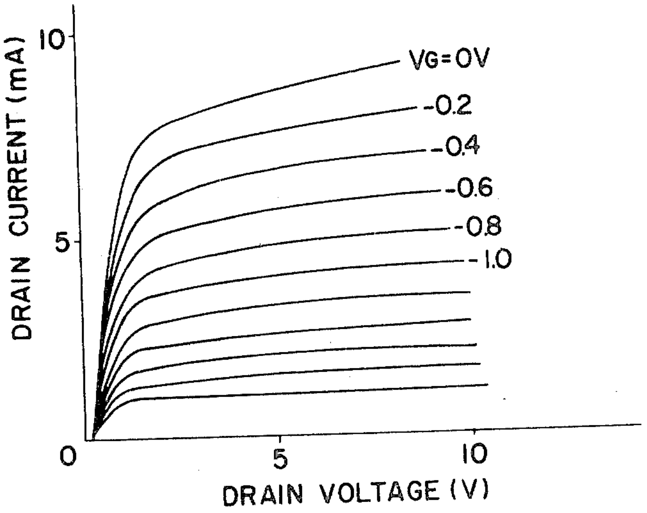

FIGS. 4 and 5 are graphical representations indicating respectively the characteristics of a known semiconductor devices and an embodiment of the semiconductor device according to the invention.

Figures 1, 2, 3A, 3B, 3C:
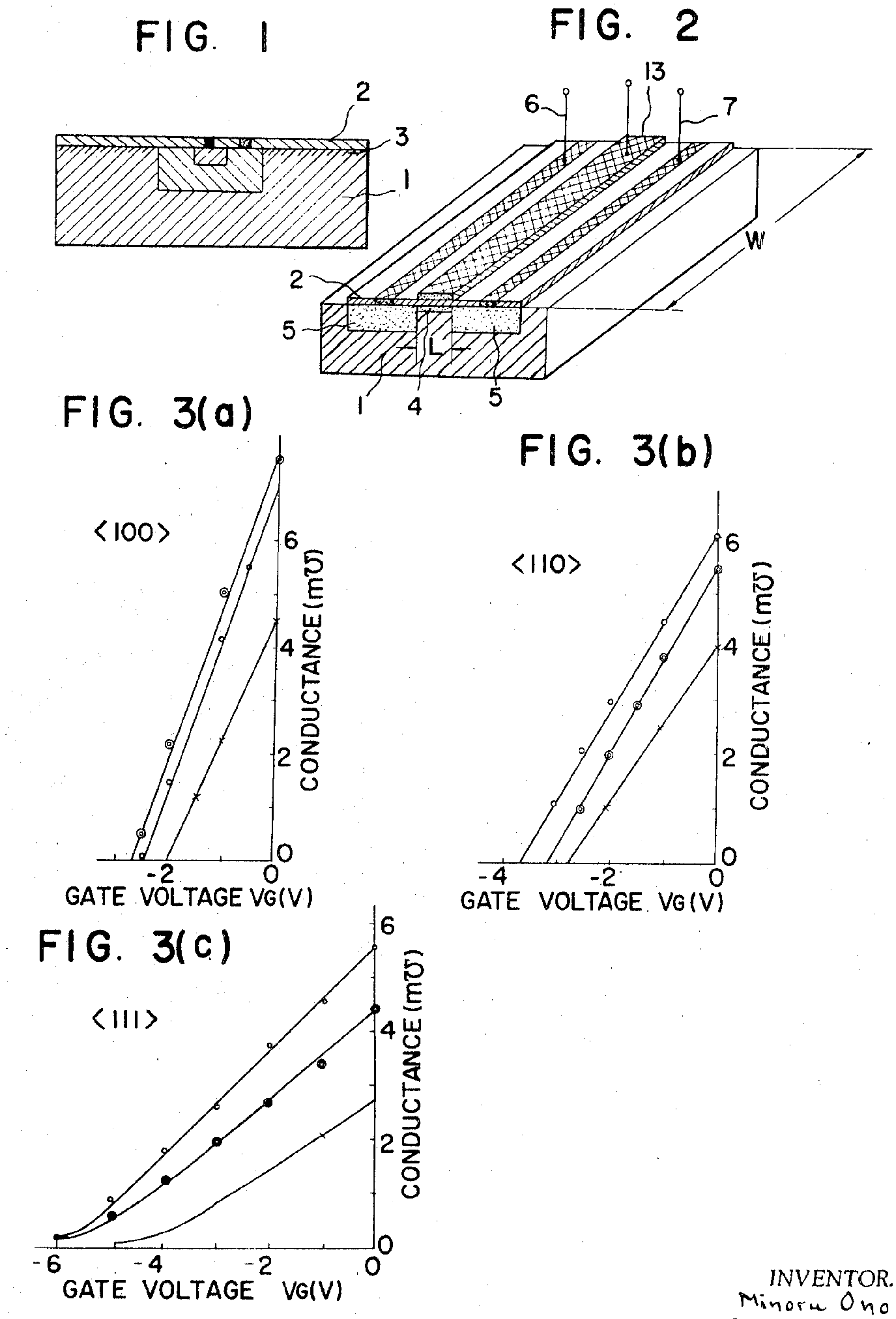
FIG. 1 is a sectional view showing an ordinary planar transistor.
FIG. 2 is a perspective view including a part in section for a description of the principle of the invention.

The aforementioned channel effect appears, naturally, also in an ordinary planar transistor as shown in FIG. 1. For example, when a $SiO_2$ film 2 is formed on a surface of a P-type silicon substrate 1 which lies in parallel with a 111 crystal plane, an N-type inversion layer 3 is formed by the channel effect on the surface of the semiconductor 1 immediately below the film 2. This layer 3 spreads over the entire surface of the substrate 1 and gives rise to adverse results such as increase in the collector cutoff current $I_{co}$ of the transistor.

For reducing this disadvantage, one known method is the aforementioned measure of combining heating treatment and voltage application in such a manner as to reduce the size of the channel layer. However, even by this measure, there has been a lower limit to the size of the controllable channel layer, that is, a lower limit below which the surface donor density cannot be reduced. The existence of a definite lower limit to the surface donor density within the channel layer means that in a device such as a field-effect transistor in which such a channel layer is applied, the drain current at the time of zero gate voltage cannot be decreased below a certain value.

The present invention contemplates overcoming the above described disadvantage and producing a semiconductor device wherein, by using a crystal lane (such as a 110 plane or a 100 plane) other than a 111 plane, namely by avoiding to use as a major surface for semiconductor devices a 111 plane which has been used in conventional semiconductor devices, the lower limit of the semiconductor surface donor density is further in and the drain current as i the above mentioned field-effect transistor is further decreased.

The principle of the invention will be apparent from the following description with reference to FIG. 2 showing a semiconductor device fabricated in the following manner. An $SiO_2$ oxide film 2 is grown on a P-type silicon semiconductor substrate 1, and a metal electrode 3 is provided on the film 2. The formation of the $SiO_2$ film 2 causes a channel layer 4 to appear on the surface of the semiconductor substrate 1.

Regions 5 of N-type conductivity are formed within the substrate 1 as shown, and terminal electrodes 6 and 7 are attached to respective regions 5. Then, with the device in this state, the conductance G between the terminals 6 and 7 is measured. This conductance may be expressed by the following equation.

$$G=(q\cdot N_{DS}-Q)\mu d\cdot(W/L) \quad (1)$$

where:

- $q$ is the electron charge;
- $N_{DS}$ is the surface donor density;
- $Q$ is the charge on electrode 3; and
- $\mu d$ is the surface electron mobility.

$Q$ is a charge applied from the outside, and when $Q=0$, the above equation becomes $G=q\cdot N_{DS}\cdot\mu d\cdot(W/L)$, and $G$ is proportional to the surface donor density $N_{DS}$.

If a voltage $V_G$ is applied to the gate electrode 3, $$q\cdot N_{DS}=Q \quad (2)$$

for $V_G=V_{GO}$, and $G$ will become equal to 0. Then, $$Q=V_{GO}\cdot C_G, \quad (3)$$

where:

$C_G$ is the capacitance of the gate.

From equation (3), it is possible to determine $Q$. Therefore when $G=0$, then, $q\cdot N_{DS}=Q$, and now considering the case $Q=V_{GO}\cdot C_G$, the surface donor density $N_{DS}$ becomes expressable by the following equation.

$$N_{DS}=V_{GO}\cdot C_G/q \quad (4)$$

The invention will now be described with respect to cases wherein, on the basis of the above equation, field-effect transistors are fabricated respectively by using [111], [110], and [100] plane crystals.

In each case, as indicated in FIG. 2, a silicon crystal 1 of P-type conductivity of 100 ohm cm. resistivity is used; a $SiO_2$ film 2 of approximately 1,500 angstroms is grown on the crystal 1; and then a gate electrode 13 of aluminum is deposited by evaporation on the film 2. A channel layer 4 is produced on the surface of the semiconductor crystal 1. In addition, N-type regions 5 of 1,600-micron length and approximately 10-micron depth are formed with a spacing therebetween of 7 microns on the crystal 1 and are provided respectively with a source electrode 6 and a drain electrode 7. The N-type regions 5 are formed for the purpose of providing ohmic contacts with respect to the channel.

In order to decrease the surface donor density $N_{DS}$ of the channel layer 4 of each of the field-effect transistors produced in the above described manner, a DC voltage of 5 volts is applied between the gate electrode 13 and the source electrode 6 (or the drain electrode 7) with the positive polarity applied to the source electrode 6 (or electrode 7). Then, as this voltage is applied, each transistor is heat treated at 350° C. for 2 hours, whereupon the surface donor density of the channel layer 4 is found to have decreased remarkably relative to that prior to treatment and to have reached a minimum donor density.

The relationship between the gate voltage $V_G$ ($V$) and the conductance $G$ ($m\Omega$) between the source and drain electrode of field-effect transistors after treatment in the above described manner is found to be as graphically indicated in FIG. 3, in which (*a*), (*b*), and (*c*) respectively show graphs for transistors in which the [100], [110], and [111] crystal planes are used. The results, including the relationship to surface electron mobility, may be represented as shown in the accompanying Table 1.

TABLE 1

| Constant: axis | $V_{GO}$ (volt) | $[N_{DS}]$ min. | $\mu_d$ (cm.²/V. sec.) |
|---|---|---|---|
| {111} | −5.5 | 8.3×10¹¹/cm.² | 150 |
| {110} | −3.3 | 5.0×10¹¹/cm.² | 320 |
| {100} | −2.3 | 3.5×10¹¹/cm.² | 530 |

As is apparent from Table 1 the values of gate voltage $V_{GO}$ corresponding to $G=0$ become smaller in the order of the crystals of [111], [110], and [100] planes. Since this voltage $V_{GO}$ is proportional to the surface donor density $N_{DS}$ as can be observed from equation (4), a small value of $V_{GO}$ means a small value of $N_{DS}$. Therefore, it is apparent that the values of surface donor density $N_{DS}$ of the channel layers 4 of the above mentioned three kinds of crystal planes become smaller in the above said order.

Furthermore, a high electron mobility $\mu d$ means a large conductance variation with respect to gate voltage variation, that is, a high-voltage sensitivity, which is advantageous particularly for production of MOS-type field-effect transistors.

The present invention, which is based on the above considerations, is characterized in that a crystal plane other than a [111] plane, particularly a [100] plane or a [110] plane crystal, is used.

In order to indicate more fully the nature of the invention, the following typical example of procedure are set forth, it being understood that this example is presented as illustrative only, and that it is not intended to limit the scope of the invention.

Two silicon substrates 1 of crystals respectively having [111] and [100] planes on their surfaces are prepared and rendered into P-type semiconductors of 4 ohm cm. resistivity. Each crystal 1 is heat treated for 20 minutes in an atmosphere containing steam at approximately 1,000° C. to form thereon a $SiO_2$ film 2 of approximately 1,500 angstrom thickness as indicated in FIG. 2. As a result, a channel layer 4 is formed immediately below the $SiO_2$ film 2. Aluminum is deposited by evaporation on the $SiO_2$ film 2 to form a gate electrode 13 of dimensions $L=5$ microns and $W=1{,}600$ microns, said dimensions L and W being shown in FIG. 2. In addition, N-type regions 5 of 1,600-micron length, 10-micron depth, and a resistivity of approximately 0.5 ohm cm. are formed in the crystal 1 as shown with a spacing of 7 microns therebetween, and a source electrode 6 and a drain electrode 7 are respectively connected thereto.

A 5-volt DC voltage is applied across the source electrode 6 (or drain electrode 7) and the gate electrode 13 of the device fabricated by the above described procedure, the voltage being applied with positive polarity to the electrode 6 (or 7). Then, as the voltage is so applied, the device is heat treated at 350° C. for 1 hour or longer, this treatment being continued until the surface donor density of the channel layer 4 reaches a minimum.

The impressed DC voltage, the heating temperature, and the treatment time set forth above are merely illustrative examples; and a shorter treatment time suffices when the impressed DC voltage is raised. The heating temperature should be at least 75° C. in the case of treatment of a silicon substrate. Otherwise, the surface donor density cannot be reduced to the minimum value. The only requirement is that the combination of the above-mentioned three factors of this treatment be such that the surface donor density of the channel layer 4 is decreased.

As a result of the above described treatment, different values of the minimum surface donor density depending on the crystal plane are obtained as indicated in Table 1. These values cannot be decreased below respective limiting values. More specifically, as a result of calculation from equation (4), the minimum value is $5\times10^{11}$/cm.² in the case of the [111] plane crystal and $2\times10^{11}$/cm.² in the case of the [100] plane crystal. Thus, this value of the device of the present invention is ½·5 of that of a conventional device.

Characteristics of a MOS-type field-effect transistor of known type and of the present invention are indicated in FIGS. 4 and 5. As is apparent from FIG. 5, by the practice of this invention, the spaces between the curves for different voltages $V_G$ become much wider. This indicates that the mutual conductance $g_m$ in the device of the invention is higher than that of the known device, whereby a device of high gain can be produced.

Furthermore, the rising slopes of the current-voltage curves in the low-voltage region of the drain voltage are steeper than those of the known device, whereby it is evident that a device of high sensitivity can be produced.

The application of the present invention is not limited to that to field-effect transistors. For example, when the invention is applied to a planar transistor, the thickness of the channel layer can be decreased. Accordingly, the value of the collector cutoff current $I_{co}$ can be substantially decreased, and a planar transistor having highly desirable characteristics can be produced. It will also be obvious that the present invention can be applied additionally to MOS-type diodes.

It should be understood, therefore, that the foregoing disclosure relates to only an illustrative embodiment of the invention and that it is intended to cover all changes and modifications of the example of the invention herein chosen for the purposes of the disclosure, which do not constitute departures from the spirit and scope of the invention as set forth in the appended claims.

What we claim is:

1. A field-effect-type semiconductor device comprising
- a silicon single crystalline substrate of a first conductivity type having a substantially plane major surface lying substantially parallel to a [100] crystal plane;
- a pair of source and drain regions of a second conductivity type opposite to said first conductivity type disposed in said major surface;
- an oxide film covering at least a portion of said major surface between said source and drain regions; and
- a gate electrode formed on said film covering said portion of said major surface between said source and drain regions.

2. A planar-type semiconductor device comprising
- a monocrystalline silicon body having a substantially plane major surface lying substantially parallel with a [109] crystal plane and including
- a first region of a first conductivity type extending to said major surface,
- a second region of a second conductivity type opposite to said first conductivity type formed in said major surface and forming with said first region a first PN-junction extending to said surface and defining a first enclosure of the second region,
- a third region of said first conductivity type formed in said major surface and in said second region and forming with said second region a second PN-junction extending to said major surface and defining a second enclosure of said third region in said first enclosure;
- an oxide film covering said major surface of said substrate; and
- electrode means connected to said second and third regions.

3. A field-effect-type semiconductor device comprising
- a silicon single crystalline substrate of a first conductivity type having a substantially plane major surface lying substantially parallel to a [110] crystal plane;

a pair of source and drain regions of a second conductivity type opposite to said first conductivity type disposed in said major surface;

an oxide film covering at least a portion of said major surface between said source and drain regions; and a gate electrode formed on said film covering said portion of said major surface between said source and drain regions.

4. A planar-type semiconductor device comprising a monocrystalline silicon body having a substantially plane major surface lying substantially parallel with a[110] crystal plane and including a first region of a first conductivity type extending to said major surface, a second region of a second conductivity type opposite to said first conductivity type formed in said major surface and forming with said first region a first PN-junction extending to said surface and defining a first enclosure of the second region, a third region of said first conductivity type formed in said major surface and in said second region and forming with said second region a second PN-junction extending to said major surface and defining a second enclosure of said third region in said first enclosure;

an oxide film covering said major surface of said substrate; and electrode means connected to said second and third regions.

* * * * *